United States Patent
Li et al.

(10) Patent No.: US 11,366,163 B2
(45) Date of Patent: Jun. 21, 2022

(54) SOLID TESTING PLATFORM AND METHOD FOR FUNCTION TESTING OF INTELLIGENT PHASE-CHANGE SWITCH

(71) Applicant: LINCANG POWER SUPPLY BUREAU YUNNAN POWER GRID CO., LTD., Yunnan (CN)

(72) Inventors: Wen Li, Lincang (CN); Huan Chen, Lincang (CN); Hongwen Liu, Lincang (CN); Jisheng Huang, Lincang (CN); Jindong Yang, Lincang (CN); Kang Yao, Lincang (CN)

(73) Assignee: LINCANG POWER SUPPLY BUREAU YUNNAN POWER GRID CO., LTD., Yunnan (CN)

( * ) Notice: Subject to any disclaimer, the term of this patent is extended or adjusted under 35 U.S.C. 154(b) by 0 days.

(21) Appl. No.: 17/422,727

(22) PCT Filed: Nov. 13, 2020

(86) PCT No.: PCT/CN2020/128815
§ 371 (c)(1),
(2) Date: Jul. 13, 2021

(87) PCT Pub. No.: WO2021/115023
PCT Pub. Date: Jun. 17, 2021

(65) Prior Publication Data
US 2022/0043063 A1    Feb. 10, 2022

(30) Foreign Application Priority Data
Dec. 12, 2019    (CN) .......................... 201911271458.X

(51) Int. Cl.
*G01R 31/327* (2006.01)
*H02J 3/26* (2006.01)

(52) U.S. Cl.
CPC ..... *G01R 31/3275* (2013.01); *G01R 31/3277* (2013.01); *H02J 3/26* (2013.01)

(58) Field of Classification Search
CPC .......... H02J 3/36; H02J 3/26; G01R 31/3277; G01R 31/3275
See application file for complete search history.

(56) References Cited

U.S. PATENT DOCUMENTS

| | | | |
|---|---|---|---|
| 2004/0196604 A1 | 10/2004 | Matsumoto et al. | |
| 2008/0291707 A1* | 11/2008 | Fang ................. | H02M 3/33507 363/41 |
| 2010/0027304 A1* | 2/2010 | Wang ..................... | H02M 1/15 363/126 |

FOREIGN PATENT DOCUMENTS

| CN | 101071162 A | * 11/2007 |
|---|---|---|
| CN | 102354982 A | 2/2012 |

(Continued)

OTHER PUBLICATIONS

International Search Report (English and Chinese) and Written Opinion (English and Chinese) of the International Searching Authority issued in PCT/CN2020/128815, dated Jan. 28, 2021; ISA/CN.

*Primary Examiner* — Harry R Behm
(74) *Attorney, Agent, or Firm* — Harness, Dickey & Pierce, P.L.C.

(57) ABSTRACT

The present invention relates to a solid testing platform and method for function testing of an intelligent phase-change switch. The testing platform includes a primary controller, a first module, a second module, a capacitor C, an intelligent phase-change switch, and a transformer. The primary controller is respectively connected to the first module and the second module, and is configured to control the operation of the first module and the second module. The first module and the second module are connected in parallel to the capacitor (Continued)

C. the first module is configured to feed back excess energy of the capacitor C to a distribution network. The second module is configured to control magnitude and direction of a current that flows through the intelligent phase-change switch. The capacitor C is configured to perform energy support, filtering, and smoothing. According to the present invention, not only all unbalanced operation conditions can be simulated, but also simulated power is equitably fed back to a power grid by using the testing platform, to achieve a test in a state of no power loss, without affecting a main power grid.

5 Claims, 4 Drawing Sheets

(56) References Cited

FOREIGN PATENT DOCUMENTS

| | | | |
|---|---|---|---|
| CN | 106291207 | A | 1/2017 |
| CN | 108152729 | A | 6/2018 |
| CN | 108427071 | A | 8/2018 |
| CN | 108574305 | A | 9/2018 |
| CN | 208767798 | U | 4/2019 |
| CN | 110176890 | A | 8/2019 |
| CN | 110954817 | A | 4/2020 |
| DE | 4202655 | A1 | 8/1993 |
| WO | WO-2006134076 | A1 * | 12/2006 ......... G01R 31/3004 |

* cited by examiner

SOLID TESTING PLATFORM AND METHOD FOR FUNCTION TESTING OF INTELLIGENT PHASE-CHANGE SWITCH

CROSS-REFERENCE TO RELATED APPLICATIONS

This application is a U.S. National Phase Application under 35 U.S.C. 371 of International Application No. PCT/CN2020/128815, filed on Nov. 13, 2020, which claims priority to Chinese Patent Application No. 201911271458.X, filed on Dec. 12, 2019. The entire disclosures of the above applications are expressly incorporated by reference herein.

FIELD OF THE INVENTION

The present invention relates to the technical field of equipment testing, and in particular to a solid testing platform and method for function testing of an intelligent phase-change switch.

BACKGROUND OF THE INVENTION

Currently, a function testing platform of an intelligent phase-change switch can perform a test when active load is accessed, and has a problem of active loss. Meanwhile, after the load is accessed, there are disadvantages such as that active and reactive power of each phase of load cannot be arbitrarily adjusted, unbalance cannot be adjusted, and load cannot be seamlessly and transiently switched for multiple times. Therefore, how to overcome shortcomings of the prior art is a problem that urgently needs to be resolved at present in the technical field of equipment testing.

SUMMARY OF THE INVENTION

To overcome disadvantages of an existing function testing platform of an intelligent phase-change switch that active and reactive power of each phase of load cannot be arbitrarily adjusted, unbalance cannot be adjusted, and load cannot be seamlessly and transiently switched for multiple times, the present invention provides a solid testing platform and method for function testing of an intelligent phase-change switch. In this way, not only all unbalanced operation conditions can be simulated, but also simulated unbalanced power is equitably fed back to a power grid by using the testing platform, to achieve a test in a state of no power losses, without affecting a main power grid.

To achieve the foregoing objective, the present invention uses the following technical solutions.

A solid testing platform for function testing of an intelligent phase-change switch, including a primary controller, a first module, a second module, a capacitor C, an intelligent phase-change switch, and a transformer, where the primary controller is respectively connected to the first module and the second module, and is configured to control the operation of the first module and the second module;

one end of the first module is connected to an output end of the transformer;

one end of the second module is connected to a direct current output end of the intelligent phase-change switch;

the other end of the first module and the other end of the second module both are connected to the capacitor C, and the first module, the second module and the capacitor C are connected in parallel;

the first module is configured to feed back excess energy of the capacitor C to a distribution network;

the second module is configured to control magnitude and a direction of a current that flows through the intelligent phase-change switch; and the capacitor C is configured to perform energy support, filtering, and smoothing.

There are several second modules.

The first module includes a converter composed of eight switch tubes and a passive filter (an LC filter); and after performing inverter control by the first module to power absorbed by the second module, the power is further filtered out high-frequency harmonic wave through the LC filter and then transmitted back to the distribution network.

The second module includes a single-phase H bridge and a filter inductor LN; after performing harmonic wave filtering by the filter inductor LN to power absorbed by the second module, the power is further performed with rectification control through the single-phase H bridge and then transmitted back to a direct current capacitor C.

A sampling module is further included, where the sampling module is connected to the primary controller; the sampling module is configured to collect a three-phase voltage of a power grid, a voltage of the capacitor C, an output current of the first module, and an input current of the second module, and transmit collected data back to the primary controller; and the primary controller controls, after performing rectification control and inverter control, switch tubes in the first module and the second module to be started.

Meanwhile, the present invention provides a solid testing method for function testing of an intelligent phase-change switch, adopting the foregoing solid testing platform for function testing of an intelligent phase-change switch, and including the following steps:

setting, in the primary controller, values of active and reactive power that need to be absorbed by each second module, and distributing the same to each corresponding second module;

collecting, by the sampling module, physical quantities such as a three-phase voltage of the power grid, a voltage of the capacitor C, an output current of the first module, and an input current of the second module, and distributing relevant physical quantities to the first module and the second module;

performing rectification control by the second module based on the physical quantities, the active power value, and the reactive power value that are distributed by the primary controller, and absorbing electric energy and transferring the same to the direct current capacitor C;

determining a working state at this time by the first module based on a voltage value of a direct current capacitor C that is distributed by the primary controller, and then performing inverter control, to feed back excess energy on the direct current capacitor C to a main power grid; and further enabling a function of a tested intelligent phase-change switch to verify when construction of unbalanced operation condition of the solid testing platform is finished at this time.

It may be learned from the foregoing technical solutions that this application provides a solid testing platform and method for function testing of an intelligent phase-change switch. The solid testing platform for function testing of an intelligent phase-change switch includes the primary controller, the first module, the second module, the capacitor C, the intelligent phase-change switch, and the transformer. The primary controller is respectively connected to the first module and the second module, and is configured to control the operation of the first module and the second module. One end of the first module is connected to the output end of the transformer. One end of the second module is connected to the direct current output end of the intelligent phase-change switch. The other end of the first module and the other end of the second module both are connected to the capacitor C, and the first module and the second module are connected in parallel to the capacitor C. the first module is configured to feed back excess energy of the capacitor C to the distribution network. The second module is configured to control magnitude and direction of a current that flows through the intelligent phase-change switch. The capacitor C is configured to perform energy support, filtering, and smoothing. According to this application, through controlling the intelligent phase-change switch, it is achieved that total input power and total output power of a testing platform of a power electronic platform are equal, and the intelligent phase-change switch is tested with zero power losses, thus greatly reducing energy losses.

1 Primary Controller
2 First Module
3 Second Module
4 Capacitor C
5 Intelligent Phase-Change Switch
6 Transformer
7 Sampling Module

DETAILED DESCRIPTION OF THE EMBODIMENTS

The present invention is described in detail below with reference to the embodiments.

A person skilled in the art would understand that the following embodiments are merely used to illustrate the present invention, and should not be regarded as a limitation to the scope of the present invention. Those whose specific techniques or conditions are not indicated in the embodiments are performed according to the technologies or conditions described in the literature in this field or according to the product specification. Materials or equipment used without indicating the manufacturer are all conventional products that is commercially available.

Figure 1:
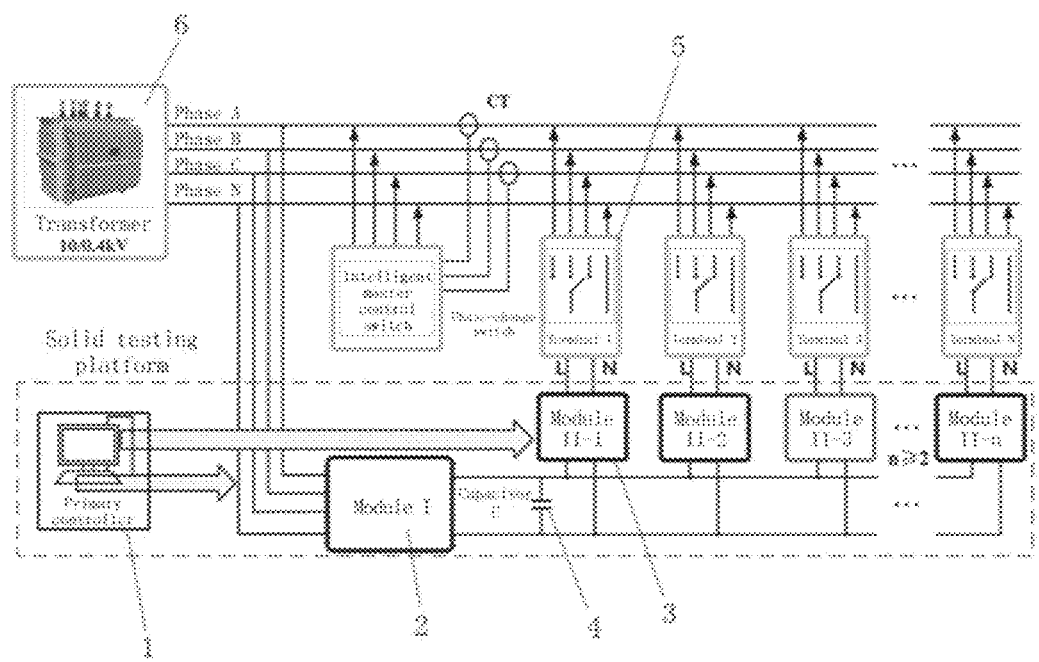
FIG. 1 is an overall structural diagram of a solid testing platform for function testing of an intelligent phase-change switch according to the present invention.
Figure 6:
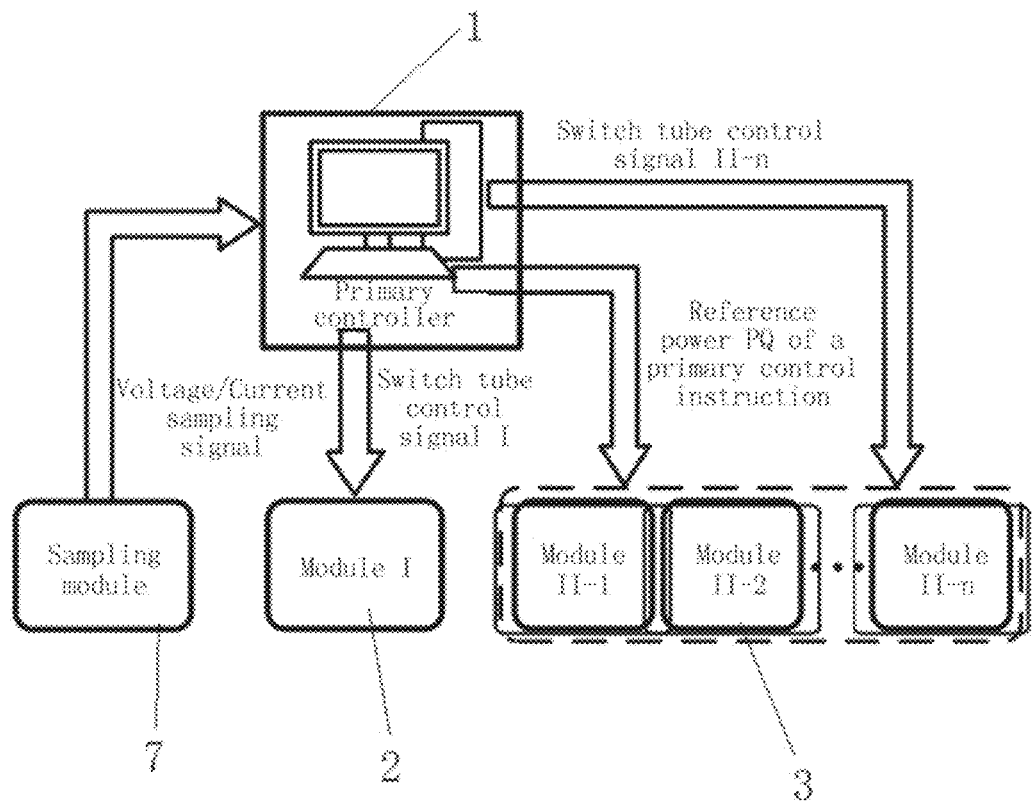
FIG. 6 is a block diagram of overall control of a solid testing platform for function testing of an intelligent phase-change switch according to the present invention.

As shown in FIG. 1 and FIG. 6, this application provides a solid testing platform for function testing of an intelligent phase-change switch, including a primary controller 1, a first module 2, a second module 3, a capacitor C 4, an intelligent phase-change switch 5, and a transformer 6.

The primary controller 1 is respectively connected to the first module 2 and the second module 3, and is configured to control the operation of the first module 2 and the second module 3.

One end of the first module 2 is connected to an output end of the transformer 6.

One end of the second module 3 is connected to a direct current output end of the intelligent phase-change switch 5.

The other end of the first module 2 and the other end of the second module 3 both are connected to the capacitor C 4, and the first module 2, the second module 3 and the capacitor C 4 are connected in parallel.

The first module 2 is configured to feed back excess energy of the capacitor C 4 to a distribution network.

The second module 3 is configured to control magnitude and direction of a current that flows through the intelligent phase-change switch 5.

The capacitor C 4 is configured to perform energy support, filtering, and smoothing.

There are several second modules 3.

The first module 2 includes a converter composed of eight switch tubes and an LC filter. The first module performs inverter control to power absorbed by the second module 3, the power is further filtered out high-frequency harmonic wave by the LC filter and then transmitted to the distribution network. The second module 3 includes a single-phase H bridge and a filter inductor LN. After performing harmonic wave filtering through the filter inductor LN to power absorbed by the second module 3, the power is further performed with rectification control by the single-phase H bridge and transmitted to a direct current capacitor C.

A sampling module 7 is further included. The sampling module 7 is connected to the primary controller 1. The sampling module 7 is configured to collect a three-phase voltage of a power grid, a voltage of the capacitor C 4, an output current of the first module 2, and an input current of the second module 3, and transmit collected data back to the primary controller 1. The primary controller 1 controls, after performing rectification control and inverter control, switch tubes in the first module 2 and the second module 3 to be started.

A solid testing method for function testing of an intelligent phase-change switch is provided, which adopts the foregoing solid testing platform for function testing of an intelligent phase-change switch, and includes the following steps:

setting, in the primary controller, values of active and reactive power that need to be absorbed by each second module, and distributing the same to each corresponding second module;

collecting, by the sampling module, physical quantities such as a three-phase voltage of the power grid, a voltage of the capacitor C, an output current of the first module, and an input current of the second module, and distributing relevant physical quantities to the first module and the second module;

performing rectification control by the second module based on the physical quantities, the active power value, and the reactive power value that are distributed by the primary controller, and absorbing electric energy and transferring the same to the direct current capacitor C;

determining a working state at this time by the first module based on a voltage value of a direct current capacitor C that is distributed by the primary controller, and then performing inverter control, to feed back excess energy of the direct current capacitor C to a main power grid; and further enabling a function of a tested intelligent phase-change switch to verify when construction of unbalanced operation condition of the solid testing platform is finished at this time.

An overall structure of the solid testing platform for function testing of an intelligent phase-change switch according to the present invention is shown in FIG. 1. In FIG. 1, the intelligent phase-change switch includes terminal 1 to terminal N. Neither an intelligent master control switch nor the intelligent phase-change switch is a structure of the testing platform in the present invention, and the two serves as an entirety to be tested.

Figure 2:
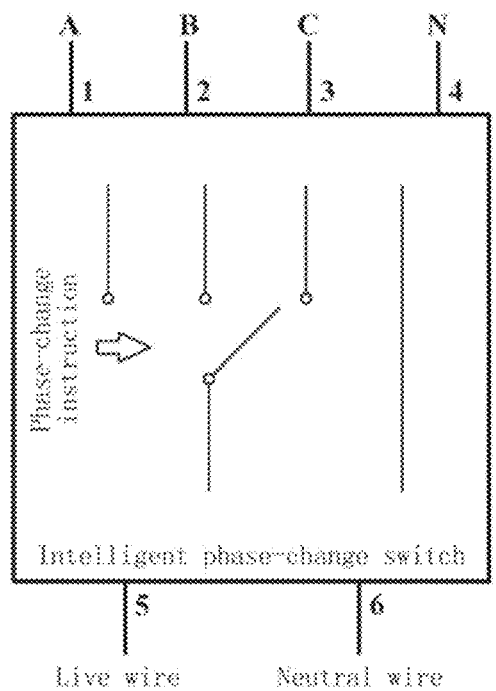
FIG. 2 is a schematic structural diagram of an intelligent phase-change switch.

The intelligent master control switch serves as a main device, and the intelligent phase-change switch serve as a slave device. The intelligent master control switch is mainly composed of current terminals, voltage terminals, and functional terminals. Some functional terminals are reserved during a design process, to help upgrade a product in the later and expand other functions. The intelligent phase-change switch is mainly composed of three-phase input terminals and single-phase output terminals. 1, 2, and 3 are ABC three-phase input terminals, 4 is N-phase input, 5 is live wire, and 6 is neutral wire. A schematic structural diagram is represented as FIG. 2. After the intelligent phase-change switch receives a command of the intelligent master control switch, within the intelligent phase-change switch, the port 5 is switched among the ports 1, 2, and 3 under an instruction, so as to achieve the objective of phase-change.

Figure 3:
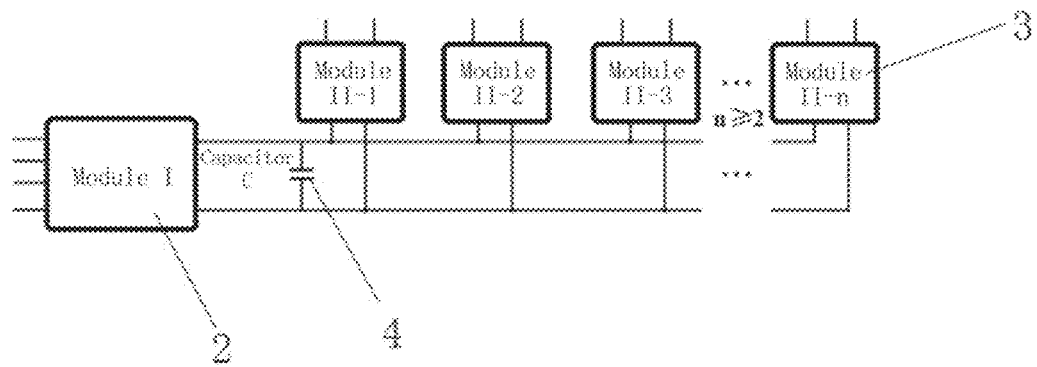
FIG. 3 is a schematic partial view of FIG. 1.

As shown in FIG. 3, it includes the first module and the second module, and both the two modules are connected to a direct current capacitor C. The first module is connected to the capacitor C and the power grid, and is mainly configured to feed back excess energy of the capacitor C to the power grid. The second module is connected to the capacitor C and the tested intelligent phase-change switch, and may control magnitude and direction of a current that flows through the intelligent phase-change switch. The capacitor C mainly has functions of energy support, filtering, and smoothing.

Figure 4:
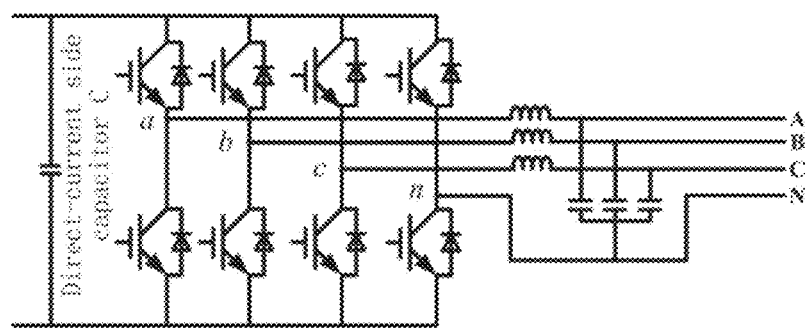
FIG. 4 is a structural diagram of a first module.

A structure of the first module is shown in FIG. 4, and the first module includes a converter composed of eight switch tubes and a passive filter (an LC filter). The converter mainly transmits, by controlling the switch tube, the power absorbed by each level of second module to the distribution network. The LC filter is designed to filter out the high-frequency harmonic wave, so that the output current is more approximate to a sine wave.

Figure 5:
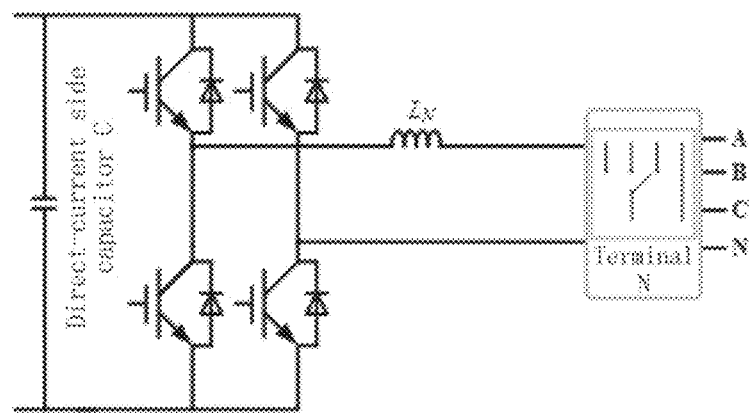
FIG. 5 is a structural diagram of a second module.

A structure of the second module is shown in FIG. 5, and the second module includes a single-phase H bridge and a filter inductor LN. The single-phase H bridge controls the absorbed power, and the filter inductor LN is mainly for filtering out the harmonic wave.

Figure 7:
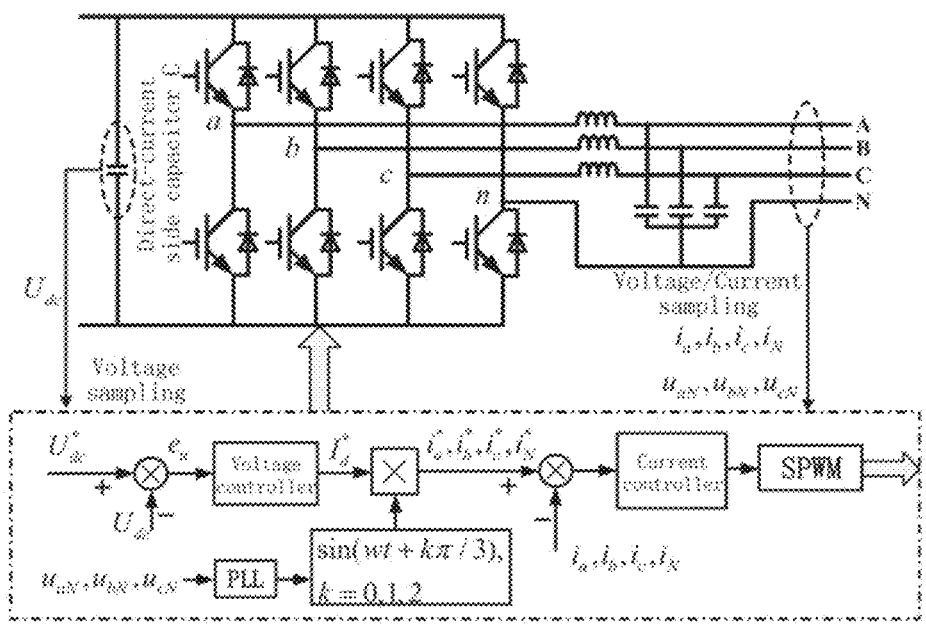
FIG. 7 is a structural diagram and a control schematic diagram of a first module.

A block diagram of overall control of a solid testing platform for function testing of an intelligent phase-change switch according to the present invention is shown in FIG. 6. A structural diagram and a control schematic diagram of a first module are shown in FIG. 7. Mainly, an amplitude value of a command current is obtained by using a voltage controller after a difference between an actual value, of a direct-current voltage obtained through direct-current voltage sampling, and a reference value is obtained. Regarding an alternating-current voltage value obtained through alternating-current voltage sampling, that is, a voltage of the distribution network, a phase of an alternating-current voltage is obtained by using a phase locked loop (PLL). An instantaneous value of a reference current may be obtained by using an amplitude value and a phase of the obtained reference current. After a difference between the instantaneous value and a sampled actual value is obtained, a modulation signal is thus obtained through the current controller. Control signals of the eight switch tubes of the converter are obtained through sine pulse width modulation (SPWM). A voltage and current controller usually adopts a PI controller. This control manner mainly aims at keeping a direct-current side capacitor voltage stable, and meanwhile transmitting energy absorbed by the second module back to the distribution network in a symmetrical three-phase form.

Figure 8:
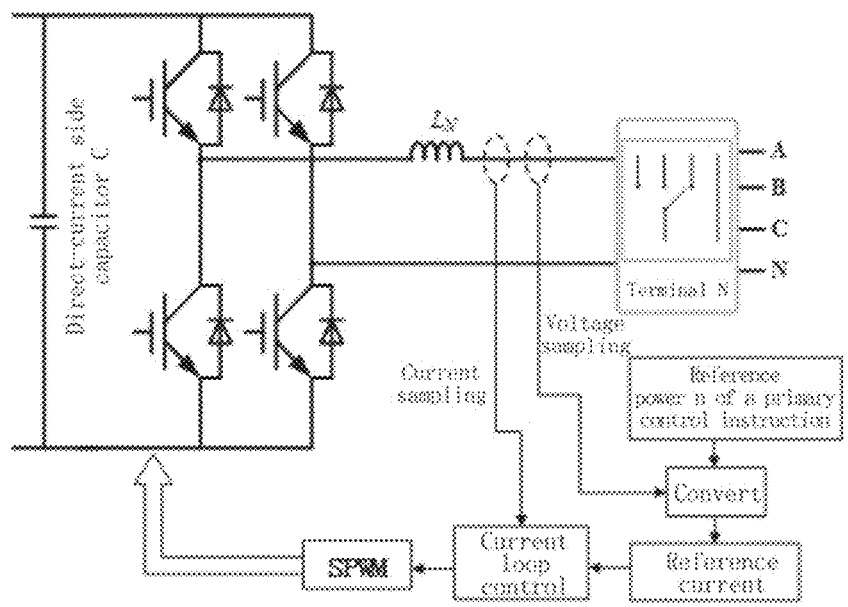
FIG. 8 is a structural diagram and a control schematic diagram of a second module.

A structural diagram and a control schematic diagram of a second module are shown in FIG. 8. Reference power n is given as required by the primary controller. Due to voltage support of the distribution network, the voltage is substantially kept unchanged. After an alternating-current side voltage signal is collected by using a voltage transformer, a reference current of the single-phase H bridge may be converted when the power is given. Meanwhile, phase tracking of the output current is ensured. After the output current after the single-phase H bridge is filtered is sampled, the reference current and a sampling current are performed with current tracking and controlling. Generally, the current is controlled by using a PI controller. A difference between the reference current and the sampling current is obtained, and a modulation signal is obtained by using the PI controller. After the modulation signal is performed with sine pulse width modulation, control signals of four switch tubes in the single-phase H bridge are obtained. That is, the reference power n is tracked and controlled, such that an objective of simulating load is achieved.

Figure 9:
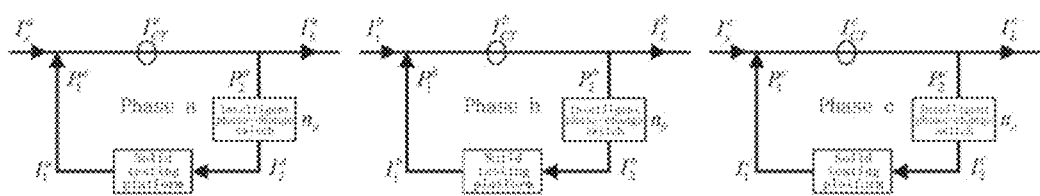
FIG. 9 is an equivalent circuit model of a solid testing platform for function testing of an intelligent phase-change switch according to the present invention.

An equivalent circuit model of a solid testing platform for function testing of an intelligent phase-change switch according to the present invention is shown in FIG. 9. Isa, Isb, and Isc represent an a-phase current, a b-phase current, and a c-phase current that are at a network side. ICTa, ICTb, and ICTc represent an a-phase current, a b-phase current, and a c-phase current that are collected by the intelligent master control switch by using the current transformer. ILa, ILb, and ILc represent three phases of currents at a load side. I1a, I1b, and I1c represent three phases of currents output by a three-phase four-wire converter. na, nb, and nc respectively represent quantities of intelligent master control switches and single-phase H bridges connected to the phases a, b, and c. I2a, I2b, and I2c respectively represent total input currents of the single-phase H bridges that are individually connected to the three phases of a, b, and c by using the intelligent master control switches. P1a, P1b, and P1c represent output power of each phase of the three-phase four-wire converter. P2a, P2b, and P2c respectively represent total power input through each phase by using the intelligent phase-change switch.

An equation and an inequality (1) can be obtained according to a circuit structure and an energy transmission path of a power electronic platform.

$$\begin{cases} I_s^{(a,b,c)} = I_1^{(a,b,c)} + I_{CT}^{(a,b,c)} \\ I_{CT}^{(a,b,c)} = I_2^{(a,b,c)} + I_L^{(a,b,c)} \\ I_1^a \neq I_2^a, I_1^b \neq I_2^b, I_1^b \neq I_2^b \\ P_1^a \neq P_2^a, P_1^b \neq P_2^b, P_1^b \neq P_2^b \\ P_1^a + P_1^b + P_1^c = P_2^a + P_2^b + P_2^c \end{cases} \quad (1)$$

It can be learned from the fifth equation in formula (1) that while ignoring losses of an electronic device, total input power and total output power that pass through a testing platform of the power electronic platform are equal, thus the intelligent phase-change switch is tested with zero power losses, thereby greatly reducing energy losses.

The basic principles, main features, and advantages of the present invention are shown and described above. A person skilled in the art should understand that the present invention is not restricted by the foregoing embodiments. The foregoing embodiments and specification are only illustrative for the principles of the present invention. Without departing from the spirit and the scope of the present invention, the present invention may have various changes and improvements, and these changes and improvements all fall within the scope of the present invention to be protected. The protection scope claimed by the present invention is defined by the appended claims and equivalents thereof.

What is claimed is:

1. A solid testing platform for function testing of an intelligent phase-change switch, comprising a primary controller, a first module, a second module, a capacitor C, an intelligent phase-change switch, and a transformer, wherein
    the primary controller is respectively connected to the first module and the second module, and is configured to control the operation of the first module and the second module;
    one end of the first module is connected to an output end of the transformer;
    one end of the second module is connected to a direct current output end of the intelligent phase-change switch;
    the other end of the first module and the other end of the second module both are connected to the capacitor C, and the first module, the second module and the capacitor C are connected in parallel;
    the first module is configured to feed back excess energy of the capacitor C to a distribution network, wherein the first module comprises a converter composed of eight switch tubes and an LC filter; and after the first module performing inverter control to power absorbed by the second module, the power is further filtered out high-frequency harmonic wave by the LC filter and then transmitted back to the distribution network;
    the second module is configured to control magnitude and direction of a current that flows through the intelligent phase-change switch, perform rectification control by the second module based on the physical quantities, the active power value, and the reactive power value that are distributed by the primary controller, absorb electric energy, and transfer the same to the capacitor C; and
    the capacitor C is configured to perform energy support, filtering, and smoothing.

2. The solid testing platform for function testing of an intelligent phase-change switch according to claim 1, wherein there are several second modules.

3. The solid testing platform for function testing of an intelligent phase-change switch according to claim 1, wherein the second module comprises a single-phase H bridge and a filter inductor LN; after performing harmonic wave filtering by the filter inductor LN to power absorbed by the second module, the power is further performed with rectification control through the single-phase H bridge and then transmitted to the capacitor C.

4. The solid testing platform for function testing of an intelligent phase-change switch according to claim 1, further comprising a sampling module, wherein the sampling module is connected to the primary controller; the sampling module is configured to collect a three-phase voltage of a power grid, a voltage of the capacitor C, an output current of the first module, and an input current of the second module, and transmit collected data back to the primary controller; and the primary controller controls, after performing rectification control and inverter control, switch tubes in the first module and the second module to be started.

5. A solid testing method for function testing of an intelligent phase-change switch, adopting the solid testing platform for function testing of an intelligent phase-change switch according to claim 1, and comprising the following steps:
    setting, in the primary controller, values of active and reactive power that need to be absorbed by each second module, and distributing the same to each corresponding second module;
    collecting, by the sampling module, physical quantities such as a three-phase voltage of the power grid, a voltage of the capacitor C, an output current of the first module, and an input current of the second module, and distributing relevant physical quantities to the first module and the second module;
    performing, by the second module, the rectification control based on the physical quantities, the active power value, and the reactive power value that are distributed by the primary controller, the absorbing of the electric energy, and the transferring of the same to the capacitor C;
    determining a working state at this time by the first module based on a voltage value of the capacitor C that is distributed by the primary controller, and then performing inverter control, to feed back excess energy on the C to a main power grid; and
    further enabling a function of a tested intelligent phase-change switch to verify when construction of unbalanced operation condition of the solid testing platform is finished at this time.

* * * * *